US006936086B2

(12) United States Patent
Härkönen et al.

(10) Patent No.: US 6,936,086 B2
(45) Date of Patent: Aug. 30, 2005

(54) HIGH CONDUCTIVITY PARTICLE FILTER

(75) Inventors: Kari Härkönen, Espoo (FI); Brad Aitchison, Espoo (FI)

(73) Assignee: Planar Systems, Inc., Beaverton, OR (US)

( * ) Notice: Subject to any disclaimer, the term of this patent is extended or adjusted under 35 U.S.C. 154(b) by 91 days.

(21) Appl. No.: 10/400,054

(22) Filed: Mar. 25, 2003

(65) Prior Publication Data

US 2004/0045889 A1 Mar. 11, 2004

Related U.S. Application Data

(60) Provisional application No. 60/410,067, filed on Sep. 11, 2002.

(51) Int. Cl.[7] ............ B01D 45/04

(52) U.S. Cl. ............ 55/434; 55/385.1; 55/428; 55/435; 55/441; 55/442; 55/443; 55/446; 55/452; 55/459.1; 55/461; 55/462; 55/465; 55/DIG. 14

(58) Field of Search ............ 55/307, 308, 385.1, 55/428, 429, 434, 435, 439, 441, 442, 443, 444, 445, 446, 447, 452, 459.1, 459.3, 461, 462, 465, DIG. 14; 96/380, 384, 385, 386, 387; 210/512.1

(56) References Cited

U.S. PATENT DOCUMENTS

| | | | | | |
|---|---|---|---|---|---|
| 763,199 | A | * | 6/1904 | Newton et al. | 55/433 |
| 3,062,220 | A | * | 11/1962 | Brothers | 55/442 |
| 3,446,936 | A | | 5/1969 | Hanson et al. | 219/271 |
| 3,466,424 | A | | 9/1969 | Adams | 219/275 |
| 3,541,768 | A | * | 11/1970 | Labadie | 55/433 |
| 3,559,760 | A | * | 2/1971 | Ninomiya | 60/311 |
| 3,805,495 | A | * | 4/1974 | Steel | 55/435 |
| 3,808,035 | A | | 4/1974 | Stelter | 117/106 R |
| 4,155,359 | A | * | 5/1979 | Zagorski | 55/459.1 |
| 4,419,107 | A | * | 12/1983 | Roydhouse | 55/446 |
| 4,435,199 | A | * | 3/1984 | Potkay | 55/441 |
| 4,606,739 | A | * | 8/1986 | Brannstrom | 55/435 |
| 4,615,715 | A | * | 10/1986 | Seshamani | 55/435 |
| 4,735,633 | A | | 4/1988 | Chiu | 55/2 |
| 4,895,707 | A | * | 1/1990 | Kuhn | 55/461 |
| 5,547,708 | A | | 8/1996 | Asaba et al. | 427/248.1 |
| 5,709,753 | A | | 1/1998 | Olson et al. | 118/719 |
| 5,857,326 | A | * | 1/1999 | Blanchet | 55/457 |
| 5,912,368 | A | * | 6/1999 | Satarino et al. | 55/443 |
| 6,066,209 | A | | 5/2000 | Sajoto et al. | 118/715 |
| 6,210,485 | B1 | | 4/2001 | Zhao et al. | 118/724 |
| 6,261,374 | B1 | | 7/2001 | Bang et al. | 118/726 |
| 6,354,241 | B1 | | 3/2002 | Tanaka et al. | 118/723 E |
| 2001/0054377 | A1 | | 12/2001 | Lindfors et al. | 117/104 |

FOREIGN PATENT DOCUMENTS

| | | | | | |
|---|---|---|---|---|---|
| DD | 1580 01 | A1 | | 4/1981 | |
| DD | 158001 | A | | 12/1982 | B01D/45/06 |
| DD | 158001 | | * | 12/1982 | B01D/45/06 |
| EP | 0 135 488 | A2 | | 3/1985 | |
| EP | 135488 | A | | 3/1985 | B01D/45/08 |
| WO | WO 00/49933 | | * | 8/2000 | A47L/9/16 |

* cited by examiner

*Primary Examiner*—Duane Smith
*Assistant Examiner*—Jason M. Greene
(74) *Attorney, Agent, or Firm*—Stoel Rives LLP

(57) ABSTRACT

A high conductivity particle filter provides a flow path to subject a fluid stream to a series of turns. The turns require an abrupt directional change for the fluid stream. Traps are positioned in proximity to the turns to capture particles, which have greater inertia than the fluid. The flow path may be a spiral or a series of parallel paths. A cross sectional area of the flow path may be progressively decreased to increase flow velocity and particle inertia.

61 Claims, 3 Drawing Sheets

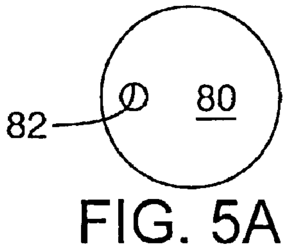
FIG. 5A
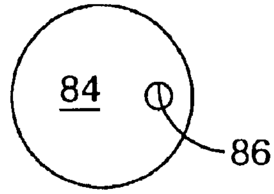
FIG. 5B
FIG. 5C
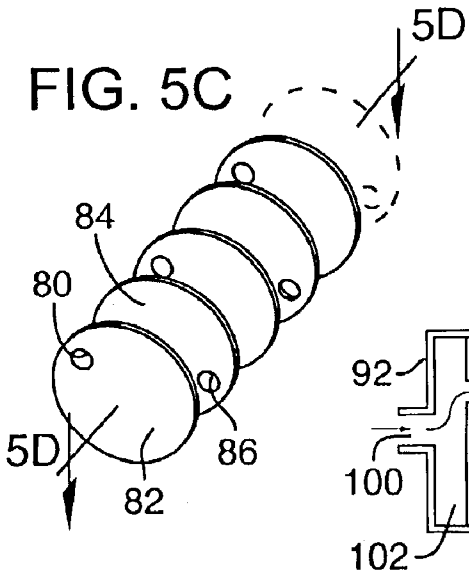
FIG. 5D
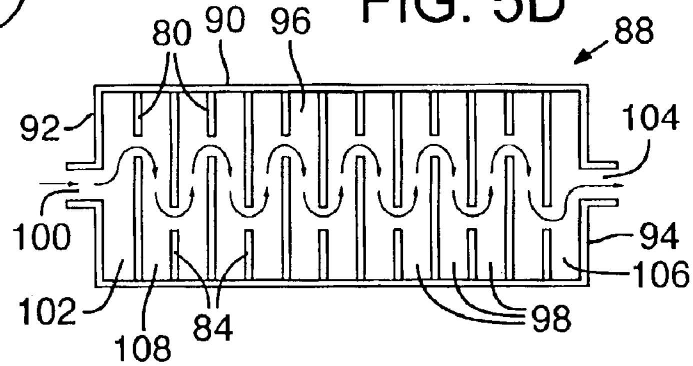
FIG. 6
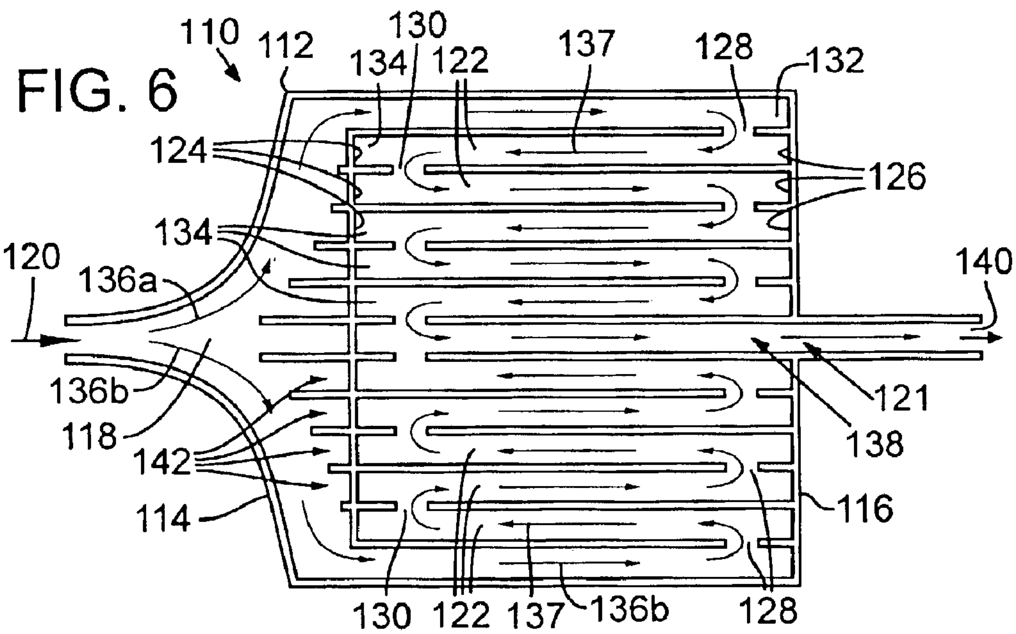

FIG. 7
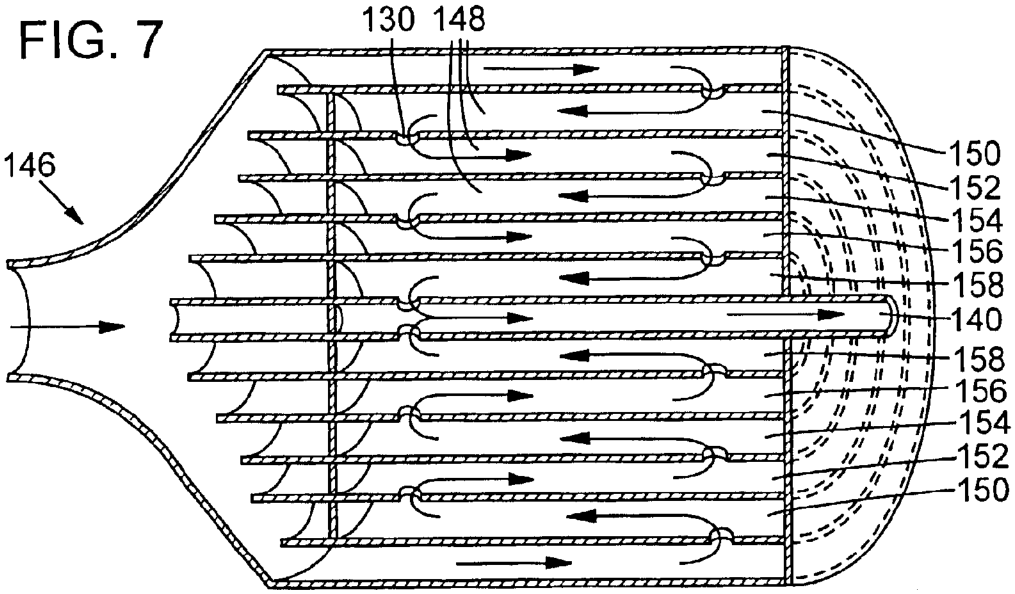
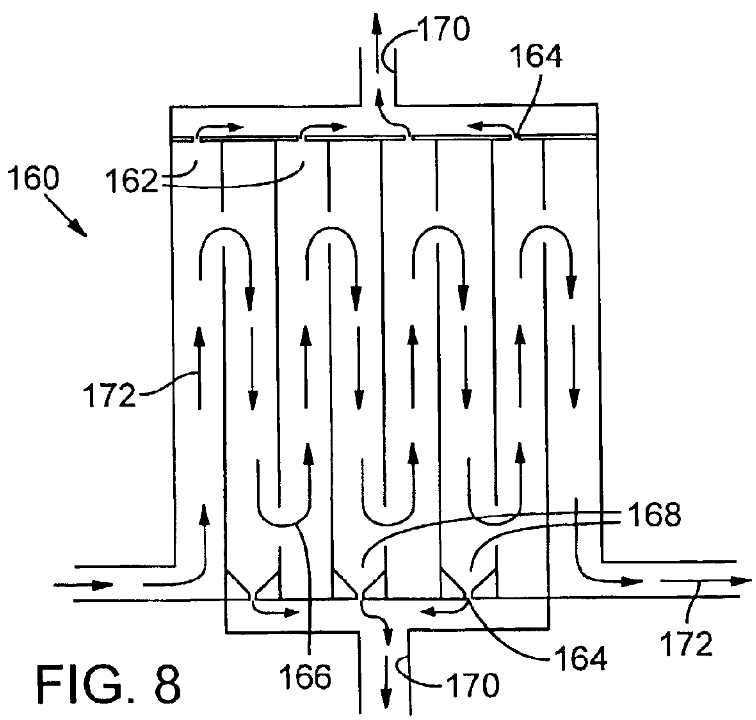
FIG. 8

HIGH CONDUCTIVITY PARTICLE FILTER

RELATED APPLICATIONS

This application claims the benefit under 35 U.S.C. § 119(e) of U.S. Provisional Patent Application No. 60/410,067, filed Sep. 11, 2002, titled "Precursor Material Delivery System for Atomic Layer Deposition," which is incorporated herein by reference.

TECHNICAL FIELD

The present invention relates to filtering methods for fluid streams, and more specifically, to filters for separating particles from precursor vapor in a thin film deposition system.

BACKGROUND OF THE INVENTION

Reactor chambers provide a controlled location for chemical processes using introduced vapor. Depending on the process, the vapor is ideally free of particles and droplets to ensure quality. Filters serve to reduce particles and droplets from entering the reactor chambers.

There are many particle filters available for chemical vapor deposition ("CVD") reactors. CVD reactors are based upon a static flow of precursor vapor and the flow resistance of the filter is not especially important.

Atomic layer deposition ("ALD"), formerly known as atomic layer epitaxy ("ALE"), is a thin film deposition process based on dynamic flows. The ALD process relies on sequential pulsing of two or more precursor vapors over a substrate in a reaction chamber. To increase the productivity of an ALD reactor, it is advantageous to switch the precursor vapors as fast as possible. The films yielded by the ALD technique have exceptional characteristics, such as being pinhole free and possessing almost perfect step coverage.

A key to successful ALD growth is to have the correct precursor vapors pulsed into the reaction chamber sequentially and without overlap. Since the actual pulses are not Delta functions (i.e., do not exhibit instantaneous rise and decay), they will overlap if the second pulse is started before the first is completely decayed. Since both highly reactive precursor vapors are present in the reaction chamber at the same time, this condition leads to non-ALD growth, and typically CVD-type growth, which can lead to film thickness non-uniformity. To prevent this problem, the pulses must be separated in time.

High-resistance elements, such as particle filters, in the flow path from the main precursor switching element to the reaction chamber can result in much longer exponential decays in the precursor pulses. With a poorly designed precursor delivery system, it is common for the purge times, defined as the time between precursor pulses, to be 10 times as long as the pulse itself to prevent overlap of the precursor pulses and achieve good film thickness uniformity. Longer purge times increase processing time, which substantially reduces the overall efficiency of the ALD reactor. To optimize the throughput of a reactor and minimize particle generation, it is, therefore, desirable to create a precursor delivery system that has the fastest possible rise and decay of the precursor pulse.

For most films grown by ALD, particles in or on the film will reduce the manufacturing yield. It is, therefore, important that the precursor source does not emit any particles. This is especially difficult when the precursor exists in powder form at standard temperature and pressure ("STP"). Powdered precursors are changed to vapor by exposing the vapor to high temperatures and low pressure. The resulting vapor contains more contaminant particles than precursors that exist in liquid or solid phase at STP, because it is difficult to eliminate contaminant particles from a powdered mixture.

A typical solution is to add a high efficiency particle filter, which is quite common for CVD systems. These filters can typically block 99.99999% of particles smaller than 0.003 microns. However, such particle filters are very resistive to flow, which leads to long precursor decay times and, therefore, long process times.

U.S. Pat. No. 6,354,241 to Tanaka et al. and U.S. Pat. No. 5,709,753 to Olson et al. disclose filters that rely on sinuous flow paths to capture undesired materials. However, materials captured in the disclosed filters are continuously exposed to the flow and may be drawn back into the flow. Thus, these filters may not provide the required filtering efficacy.

High efficiency particle filters serve well in CVD systems, which rely on static vapor flow, but have limited use with ALD systems due to the dynamic nature of the ALD process. The present inventors have recognized that efficient filters having high flow conductivity are desirable for pulsed precursor vapor delivery systems.

BRIEF SUMMARY OF THE INVENTION

A particle filter for removing particles from a fluid flow provides a flow path with several turns to separate particles with a higher inertia from the accompanying fluid. Traps are positioned in proximity to the turns to capture particles. The turns and traps ensure filter efficiency while maintaining the cross sectional area of the flow path. The turns require high-speed changes of direction, which separates particles from the fluid stream due to higher inertia of the particles. Preferred embodiments involve filtering of particles from precursor vapor in a thin film deposition system.

In one embodiment, the flow path includes a curved spiral with traps in tangential communication with the spiral. Alternatively, the flow path may be a spiral with angled turns. Traps are located before the angled turns to capture particles that are unable to negotiate the turn.

In an alternative embodiment, the filter includes a series of baffles arranged to provide a series of 180-degree turns. Traps are located proximate to the turns to capture particles.

In another embodiment, plates are sequentially disposed within a housing to define a series of chambers. Each plate has an aperture, which provides the only exit from a chamber into a subsequent chamber. Each aperture is nonaligned with adjacent apertures to provide several turns for a flow path.

In yet another embodiment, the filter includes tubes with sealed ends disposed parallel to one another. The tubes have input and output apertures that enable communication between the tubes and provide a series of turns for a flow path. The apertures further define traps adjacent to the sealed ends of the tubes.

Once the particles are separated from the fluid stream, they should be retained or removed so they cannot re-enter the fluid stream. This can be done by modifying the particle traps to include a rough or adhesive surface or to remove particles from the traps by means of a small orifice in the trap that leads to a pump.

BRIEF DESCRIPTION OF THE DRAWINGS

Non-exhaustive embodiments are described with reference to the figures, in which:

FIG. 5A is a plan view of a plate for another alternative embodiment of a particle filter;

FIG. 5B is a plan view of another plate for a particle filter;

FIG. 5C is a perspective view of plates of FIGS. 5A and 5B arranged sequentially;

FIG. 5D is a cross-sectional view of a filter incorporating the plates of FIGS. 5A and 5B arranged sequentially as shown in FIG. 5C;

FIG. 6 is a cross-sectional view of an alternative embodiment of a filter;

FIG. 7 is a cross-sectional perspective view of an alternative embodiment of a filter; and FIG. 8 is a cross-sectional view of an alternative embodiment of a filter.

DETAILED DESCRIPTION OF PREFERRED EMBODIMENTS

Figure 1:
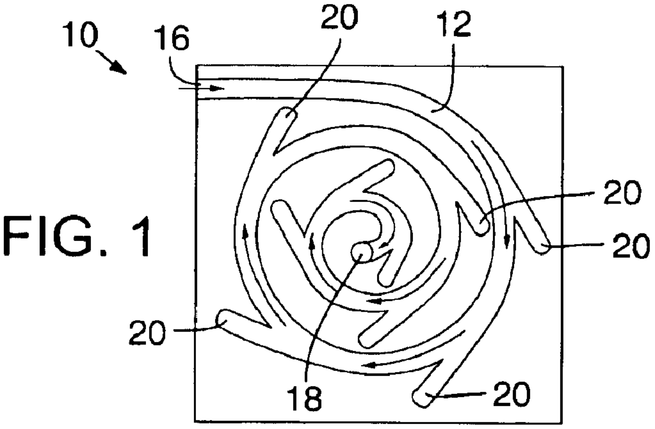
FIG. 1 is a cross-sectional view of one embodiment of a particle filter in accordance with the present invention.

Reference is now made to the figures in which like reference numerals refer to like elements.

Throughout the specification, reference to "one embodiment" or "an embodiment" means that a particular described feature, structure, or characteristic is included in at least one embodiment. Thus, appearances of the phrases "in one embodiment" or "in an embodiment" or other similar phrases in various places throughout this specification are not necessarily all referring to the same embodiment.

As used herein, the term "in communication" refers not only to components that are directly connected, but also to components that are connected via one or more other components.

Furthermore, the described features, structures, or characteristics may be combined in any suitable manner in one or more embodiments. Those skilled in the art will recognize that the invention can be practiced without one or more of the specific details, or with other methods, components, materials, etc. In other instances, well-known structures, materials, or operations are not shown or not described in detail to avoid obscuring aspects of the embodiments.

Referring to FIG. 1, a cross-sectional view of one embodiment of a particle filter 10 is shown. The filter 10 provides a primarily two-dimensional flow that captures unwanted particles. In order to separate particles from a vapor stream, the higher inertia of particles is used to separate the particles.

The filter 10 includes a flow path 12 that may be formed in a block 14. The flow path 12 is configured as a continuous spiral in communication with an input 16 and an output 18. The arrows indicate the direction of vapor flow through the flow path 12. The output 18 may be oriented perpendicular to the flow path 12. In application, the flow path 12 provides one-way directional flow of a vapor stream from the input 16 to the output 18. Configured as shown, the flow path 12 is a plane curve that moves around the fixed point of the output 18 while constantly approaching the output 18.

The flow path 12 is in communication with a plurality of tangential particle reservoirs or traps 20. As vapor travels through the flow path 12 the particles have greater inertia than the vapor. As the vapor travels through the curve, the inertia of particles does not allow the particles to follow and the particles are captured in the traps 20 while the vapor continues. Several traps 20 disposed along the flow path 12 provide a highly efficient filter 10 that does not constrain flow. The exact number of traps 20 may vary and depends, in part, on system design limitations.

The filter 10 may be formed from a block 14 of heat-resistant material, such as metal. The material may be aluminum, silicon, titanium, copper, stainless steel or other high thermal conductivity material. In manufacturing, the flow path 12 may be drilled or otherwise machined from the block 14. A lid may then be placed on the block 14 to seal the flow path 12. The filter 10 may be interchangeable in a modular system to facilitate equipment modifications, repair, and replacement. After forming the filter 10, the filter 10 may be coated with $Al_2O_3$ or other chemically resistant material to protect the filter 10 from corrosive vapors and/or abrasive particles.

Figure 2:
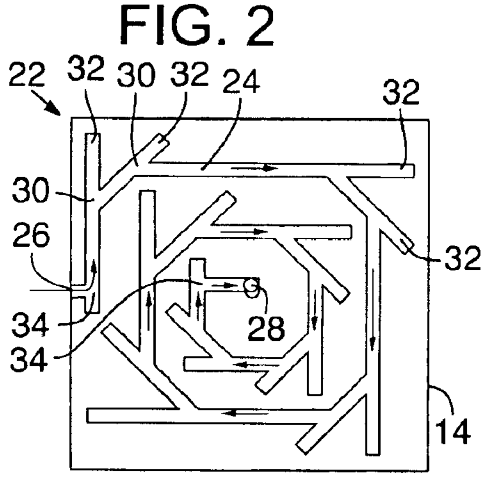
FIG. 2 is a cross-sectional view of an alternative embodiment of a particle filter.

Referring to FIG. 2, another embodiment of a filter 22 is shown that also relies on a primarily two-dimensional flow path 24. The filter 22 may be formed in a manner similar to the previous embodiment. The flow path 24 is in communication with an input 26 and an output 28. The flow path 24 is configured as a spiral, but not a curved spiral as in FIG. 1. As defined herein, the term spiral refers to a path that moves around and approaches a fixed point, such as an output. Thus, the spiral need not be continuously curving, but does move around and approaches a fixed point.

The movement around the fixed point may be achieved through angled turns 30. The angled turns 30 of FIG. 2 are approximately 45 degrees relative to the flow path 24. Of course, turns having other angles may also be used. The flow path 24 includes two angled turns 30 in order to negotiate a 90-degree turn in the block 14. One of skill in the art will appreciate that the configuration of the spiral flow path 24 may vary and the embodiments shown herein are for exemplary purposes only. For example, the block 14 may not have a rectangular cross section in which case, the flow path 24 may be adjusted accordingly. As such, the angles and the number of turns may be varied as required.

A trap 32 is disposed before an angled turn 30 such that the trap 32 continues along the direction of the flow path 24 before the angled turn 30. As the vapor stream approaches the turn, the inertia of the particles is greater than that of the vapor. As the vapor stream passes through an angled turn 30, particles continue along the former path of the flow path 24 and into a trap 32. The filter 22 includes several traps 32 to provide high filtering efficiency. The traps 32 do not limit the flow of a vapor stream, which allows for high conductivity.

The turns need not all have the same angle in order to accommodate the flow path. For example, in the embodiment shown in FIG. 2, two 90-degree angles are used for the first and last turns 34 in the flow path 24. Based on design considerations, the angles of the turns 30, 34 may vary. Furthermore, not every turn 30, 34 needs to have a corresponding trap 32. Nevertheless, in order to maximize efficiency it is desirable to include a greater number of traps.

Figure 3:
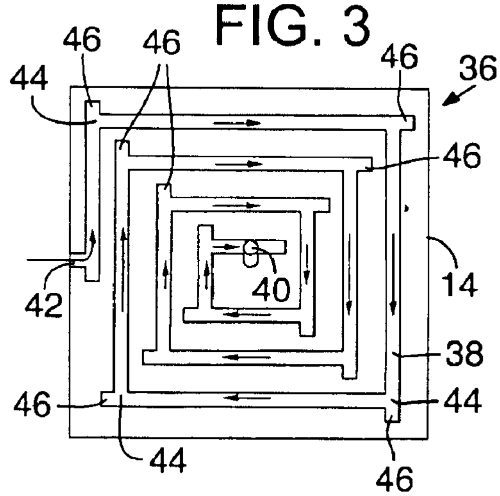
FIG. 3 is a cross-sectional view of a second alternative embodiment of a particle filter.

Referring to FIG. 3, a cross-sectional view of another embodiment of a filter 36 is shown. As in the foregoing embodiments, the filter 36 may be formed from a block 14 with a flow path 38 machined within. The flow path 38 is similar to the embodiments of FIGS. 1 and 2 in that it spirals around and approaches an output 40. The flow path 38 is also in communication with an input 42 for introducing a vapor stream into the filter 36.

The spiral flow path 38 is comprised entirely of 90-degree angled turns 44. In alternative implementations, the angle of the turns 44 may vary. A trap 46 is disposed prior to an angled turn 44 such that the trap 46 continues along the direction of the flow path 38 before the angled turn 44. As the vapor stream passes through an angled turn 44, particles continue along the former path of the flow path 38 and into a trap 46. Traps 46 may be placed prior to each turn 44 to maximize the efficiency of the filter 36.

The flow paths shown in FIGS. 1–3 may be altered into various configurations and still provide a spiral that approaches a central point. A flow path may include a combination of features heretofore described. For example, a flow path may include 45-degree angled turns, 90-degree angle turns and turns of other angles. A flow path may also include a combination of curves and angled turns. In an alternative embodiment, the input and the output may be reversed such that the flow path originates at a center point and moves around the center point as it approaches the output. In such an embodiment, the traps are disposed in an alternative configuration to capture particles. Thus, the invention is not necessarily limited to the embodiments shown, which are for exemplary purposes only.

Figure 4:
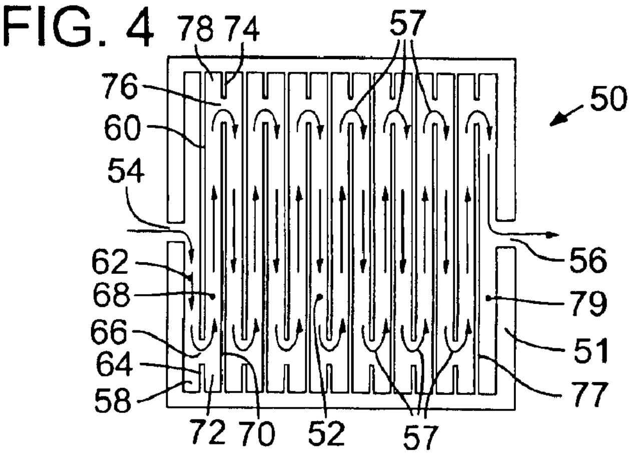
FIG. 4 is a cross-sectional view of a third alternative embodiment of a particle filter.

Referring to FIG. 4, a cross-sectional view of another embodiment of a high conductivity particle filter 50 is shown. The filter 50 may be formed from a block of heat resistant material as in previous embodiments. The filter 50 includes a housing 51 that surrounds elements of the filter 50, such as a flow path 52. The flow path 52 is in communication with an input 54 and an output 56 and includes a series of 180-degree turns 57 to separate particles from a vapor stream.

The filter 50 includes a series of baffles aligned to define paths and traps. The filter 50 includes a major baffle 60 that defines a path 62 for a vapor stream. The housing 51 provides an opposing side and also defines the path 62. A minor baffle 64, that is substantially in the same plane as a corresponding major baffle 60, defines a trap 58 to capture particles. The housing 51 also defines the trap 58. The trap 58 continues in the same direction as the path 62. The turns 57 require abrupt directional changes and particle inertia will cause particles to enter traps. As in previous filters, the trap 58 is a dead end to capture and retain particles. As the names indicate, the major baffle 60 has a greater length than the minor baffle 64. Accordingly, the path 62 is longer than a corresponding trap 58.

An aperture 66 separates the major and minor baffles and is nonaligned with a subsequent adjacent aperture. The aperture 66 may also be nonaligned with the input 54 and output 56. The aperture 66 provides the only exit for a vapor stream from the path 62 to a subsequent path. The aperture 66 may be referred to as providing the only flow path exit from the path 62. The flow path is defined as passing from the input 54 to the output 56 in the direction indicated by the arrows. Thus, the vapor stream must pass through the aperture 66 and be subject to a 180-degree angled turn 57.

As the vapor stream enters the filter 50, the vapor stream enters the path 62. The input 54 may be disposed perpendicular to the major baffle 60. The vapor stream continues along the path 62, toward the trap 58, until encountering the aperture 66. Since the vapor has less inertia than the particles, the path of the vapor will tend to bend and travel through the aperture 66. The particles, due to their greater inertia, will tend to continue on their direction and enter the trap 58.

A second major baffle 70 is disposed parallel to the first minor baffle 64, and together the first minor baffle 64 and the second major baffle 70 defines a pocket 72 that serves as a secondary trap to capture particles ejected from the flow path 62 after the flow path has passed through the aperture 66.

A vapor stream passing through the aperture 66 enters a second path 68 that is defined by the second major baffle 70 and the first major baffle 60. The second major baffle 70 is disposed to create a 180-degree turn 57 for the vapor stream. The second major baffle 70 is separated from a second minor baffle 74 by a second aperture 76. The second minor baffle 74 is substantially in the same plane as the second major baffle 70 and defines a second trap 78. The second trap 78 continues in the same direction as the second path 68 to capture particles. The second major baffle 70 is longer than the second minor baffle 74 as the second path 68 is longer than the second trap 78.

The second aperture 76 provides the only exit for a vapor stream passing from the first path 62 to the second path 68. The second aperture 76 is nonaligned with the aperture 66 or a subsequent downstream aperture.

Additional major and minor baffles with separating apertures may be similarly disposed to create a series of 180-degree turns 57 and corresponding traps. Some particles, especially smaller particles, may be able to follow the vapor through one or more apertures without being captured in a trap. Further, while the traps are designed to retain particles, it remains possible for particles collected in a trap to be drawn back into the vapor stream. Accordingly, multiple stages of filtering are used to increase the overall effectiveness of the filter 50.

To increase the chances that a particle will be captured, the velocity of the stream should be as high as possible at the turn 57. The inertia differences that separate particles from the vapor are a function of the velocity of the flow and, in particular, the velocity of the particles. Accordingly, the path leading up to a trap should be as long as space allows, which will allow sufficient room in which to accelerate the particles to a substantial linear velocity before reaching the turn adjacent the trap.

The output 56 may be disposed perpendicular to a final major baffle 77 and is in communication with a final path 79. The number of baffles and turns may vary based on design considerations, but allows for high conductivity while maintaining the efficiency of the filter 50.

The surface of each trap 58, 78 and pocket 72 may be modified to help retain particles in the traps and pockets. For example, one or more of the trap and pocket surfaces may be roughened or have an adhesive coating applied, to cause particles to adhere to the surfaces. The entire flow path may include a rough surface or an adhesive coating as well. In this implementation, particles traveling through the flow path would be collected and retained by the flow path surface.

Referring to FIG. 5A, a plan view of a plate 80 for use in another embodiment of a high conductivity particle filter is shown. The plate 80 may be formed of a heat resistant material and in any number of shapes including a circle, oval, ellipse, rectangle and the like. The plate 80 includes an aperture 82 that provides an exit for a vapor stream passing through a filter. The aperture 82 may be aligned off-center so as to be nonaligned with a filter input and output. The aperture 82 is not disposed on the perimeter or edge of the plate 80, rather the aperture 82 is disposed at an intermediate location on the surface area of the plate 80. As such, the surface area of the plate 80 surrounds the aperture 82, and the aperture does not contact a perimeter of the plate 80. The plate 80 serves as a retaining wall to capture and retain particles.

Referring to FIG. 5B, a plan view of a second plate 84 is shown for use in series with the plate 80 of FIG. 5A. The second plate 84 may be formed of a similar shape and size as the first plate 80. The second plate 84 also includes a second aperture 86 that provides an exit for vapor stream passing through a filter. As with the first plate 80, the aperture 86 is disposed at an intermediate location on the surface area of the plate 80. The second plate 84 may, in fact, be identical to the first plate 80. However, when disposed adjacent to the first plate 80, the second plate 84 may be rotated 180 degrees such that the second aperture 86 is nonaligned with the first aperture 82.

Referring to FIG. 5C, a perspective view of a series of plates 80, 84 is shown. The plates 80, 84 are aligned as they may be disposed in a high conductivity particle filter. The number of plates 80, 84 may vary based on design considerations and desired filtering efficiency. Each plate 80, 84 is spaced apart from one another to form a chamber therebetween. The plates 80, 84 are disposed such that the apertures 82, 86 are nonaligned with sequential apertures. For good conductivity, the spacing between the plates is preferably the same as the average diameter of the aperture, which is preferably the same as the average diameter of the input and output.

Referring to FIG. 5D, a cross-sectional view of a particle filter 88 is shown which includes plates 80, 84 within a housing 90. The housing 90 couples to each plate 80, 84 and fixes the plates 80, 84 in spaced-apart relation. The housing 90 may be cylindrical or other shape, and has sealed first and second ends 92, 94 to define an interior 96. The housing 90 and the plates 80, 84 define multiple sequential chambers 98 within the interior 96. The housing 90 is secured to each plate 80, 84 so that the corresponding aperture 82, 86 provides the only exit from one chamber 98 to an adjacent chamber.

An input 100 provides passage through the first end 92 and is in communication with a first chamber 102. Similarly, an output 104 provides passage through the second end 94 and is in communication with a final chamber 106. The input 100 and output 104 may be disposed perpendicular to the surface area of the plates 82, 84. The input 100 and output 104 may be nonaligned with the sequential apertures 82, 86.

The filter 88 may be characterized as providing a three-dimensional flow path, as vapor movement is not primarily confined to two dimensions. A vapor stream must pass through the provided aperture to exit each chamber and undergoes a series of turns. Sequential apertures 82, 86 should be distanced from each other as much as possible to lengthen the flow path and increase the velocity of the vapor stream. As the vapor stream passes through the apertures 82, 86, the particles, having a greater inertia, will continue along their former path and collect in traps of the chambers 98 adjacent the apertures. A series of plates 80, 84 and chambers 98 provide a highly efficient filter without unnecessary flow resistance. The interior surfaces of the chambers 98 may be modified to encourage particle adhesion. For example, the interior surfaces of a chamber 98 may be roughened or coated with an adhesive to retain particles.

In one embodiment (not shown), the plates 80, 84 may be spaced progressively closer to one another along a flow path to sequentially decrease the volumes of the chambers. Accordingly, the first chamber 102 would have a greater volume than the second chamber 108, the subsequent chamber would have a volume less than the second chamber 108, and so forth. The final chamber 106 may be configured with the smallest volume of all the previous chambers. Progressively decreasing the chamber volumes gradually decreases the cross-section of the flow path through the filter 88 and increases the velocity of a vapor stream. An increased vapor stream velocity increases the likelihood of smaller particles being retained in a trap 98. Apertures 82, 86 may also have sequentially decreasing diameters to decrease the cross-section of the flow path.

Referring to FIG. 6, a cross-section of another embodiment of a particle filter 110 is shown. The particle filter 110 includes a housing 112 with sealed first and second ends 114, 116, which define an interior 118. The filter 110 includes an input 120 and an output 121, which allows passage through the first and second ends 114, 116 respectively.

The filter 110 includes tubes 122 that are disposed parallel to one another. Each tube 122 has scaled first and second ends 124, 126 and a first (input) aperture 128 and a second (output) aperture 130 disposed along the length of the tube 122. The apertures 128, 130 allow for a flow path 136 through the tube 122 and define traps 132, 134 within tubes 122. The traps 132, 134 extend from corresponding apertures 128, 130 to the respective second and first sealed ends 126 and 124. As such, each trap 132, 134 is a "dead end" in which particles are captured and retained in a manner similar to previously described embodiments.

Each tube 122 includes a path 137 which may be generally defined as the length of the tube 122 from the first aperture 128 to the second aperture 130. Vapor exiting the path 137 must turn through the output aperture 130 and particles, having a higher inertia than the vapor, continue in the same direction and enter a trap 134.

The tubes 122 are in communication with one another to provide a sinuous flow path that includes a series of paths 137 and turns. Traps 132, 134 are disposed adjacent each aperture 128, 130 to capture particles unable to negotiate a turn. The number of tubes 122 used for a flow path may vary based on system design constraints and desired efficiency of the filter 110.

The first and second apertures 128, 130 provide communication between the tubes 122 in the filter 110 as shown in FIG. 6. Thus, whether an aperture may be characterized as an input or output is relative to the tube since an output for one tube is an input for an adjacent tube.

The last tube in the flow path is defined herein as the output tube 138 and is in communication with or passes through the output 121. The output tube 138 may have an open end 140 to provide an exit for the vapor stream as shown in FIG. 6. Alternatively, the output tube 138 may have one or more output apertures.

In the embodiment shown in FIG. 6, the filter 110 provides split paths 136*a* and 136*b*. After passing through the input 120 into the interior 118, the vapor stream is bifurcated into the two flow paths 136*a* and 136*b*. Each flow path passes through a series of parallel tubes 122 configured with paths 137 and apertures 128, 130. The flow paths 136*a* and 136*b* merge when reaching the output tube 138 before exiting the filter 110. One of skill in the art will appreciate that the tubes 122 may be arranged in series to provide a single flow path, or two or more flow paths.

The filter 110 may further include one or more preliminary traps 142 adjacent the input 120. The preliminary traps 142 may be formed by the extending the walls of the tubes 122 beyond their sealed first ends 124. The preliminary traps 142 may be disposed such that incoming vapor stream must turn and pass over the traps 142 before entering into the tubes 122. As in previous embodiments, the preliminary traps 142 and the previously discussed traps 132, 134 may have their interior surface roughened or coated with an adhesive to retain particles. The entire interior surface of the tubes 122 and the output tube 138 may include a rough surface or an adhesive coating to capture and retain particles.

A method of increasing velocity is to decrease the cross section of paths 137. Thus, the tubes 122 may be configured with progressively decreasing cross sectional areas in the direction of a flow path. As is well known, decreasing the cross sectional area of a flow path increases the velocity of a fluid as it travels along the flow path.

FIG. 7 is a perspective cross-section view of an alternative embodiment particle filter 146 similar to the filter 110 of FIG. 6. With reference to FIG. 7, the filter 146 is formed of concentric tubes 148 having progressively smaller diameters as the flow path traverses from a first tube 150 to subsequent tubes 152, 154, 156, and 158. The decreasing diameters of the tubes 150, 152, 154, 156, and 158 form progressively smaller cross-sectional flow areas as the flow path (or paths) proceeds to the output tube 138. Apertures 130 may also be configured with incrementally decreasing diameters along a defined flow path.

The vapor stream proceeds from tube 150 to 152 to 154 to 156 to 158 and, since the cross section is decreasing, the vapor stream velocity is increasing, thereby increasing the inertia of any particles in the vapor. The decreasing diameters and increasing particle inertia encourage separation of the increasingly smaller particles from the vapor stream as the flow proceeds to the outlet 140.

Referring to FIG. 8 another alternative embodiment of a filter 160 having high conductivity is shown. The traps 162 include an orifice 164 that is in communication with a pump or a bypass line (not shown). An orifice 164 may be effectively implemented with traps of previously discussed embodiments.

An orifice 164 may have a cross-section that is approximately 1 to 5 percent as large as the cross-sectional area of the vapor flow channel 166. The orifices 164 communicating with a pump improve the ability of the filter 160 to capture and retain particles from a vapor stream 172. The orifices 164 also provide a means for cleaning the traps in-situ, without disassembling the filter 160, to thereby prevent the traps from becoming filled with particles that might otherwise be drawn back into the vapor stream 172. The resistance of the orifices 164 should be high enough so that the majority (e.g., preferably more than 90 percent) of the vapor stream 172 flowing through the filter 160 does not go through an orifice 164, but rather continues to the exit of the filter 160.

To direct the particles toward an orifice 164, a trap 168 may have sidewalls that are tapered toward the orifice 164 in a funnel configuration. In this implementation, particles traveling through the orifice 164 are directed away from the trap 168 down a separate path 170. The particles are permanently removed from the vapor stream 172. Some traps 168 may have tapering configurations while other traps 162 do not. Furthermore, some traps 162 may have orifices 164 while others do not.

In all of the embodiments of the filters shown herein, the interior surfaces exposed to the vapor stream may be coated or passivated to prevent chemical reactions. Otherwise, the precursor vapor stream may react with the surface of the material of which the filter is made. Reactions affect the concentration of a vapor stream and destabilize a precursor delivery system. The coating or passivation may include, for example, oxides such as $Al_2O_3$, $ZrO_2$, $HfO_2$, $TiO_2$, $Ta_2O_5$, and $Nb_2O_5$; nitrides such as AlN, ZrN, HfN, TiN, TaN, and NbN; or carbides such as AlC, ZrC, HfC, TiC, TaC, and NbC; and mixtures thereof.

The high conductivity particle filters described herein provide a flow path with turns and traps to capture particles. The number of turns and traps ensure filter efficiency. The turns preferably involve abrupt high-speed changes of direction, which separates particles from vapor due to higher inertia. The filter's high conductivity offers little flow resistance, thereby speeding up precursor vapor pulse decay. Faster switching times for precursor vapor are possible due to the decreased resistance. Although the filter is described for use in a precursor vapor delivery system, the filter may also be used in a pumping line, a reaction chamber, and other applications.

Depending upon the location of the filter, the preferred dimensions and operating conditions will vary. When the filter is in a precursor delivery system of an ALD system or other thin film deposition system, it may typically operate at a temperature in the range of 120 C to 250 C and at a pressure in the range of 1 to 10 Torr with flows less than 1 standard liter per minute (slm). If the filter is located near a reaction chamber, it may typically operate at a temperature in the range of 200 C to 500 C and at a pressure of 0.5 to 5 Torr at flows in the range of 1 to 10 slm. If the filter is located in the pumping line, it may operate near room temperature at pressures in the range of 0.1 to 10 Torr and at flows in the range of 1 to 10 slm.

While specific embodiments and applications have been illustrated and described, it is to be understood that the invention is not limited to the precise configuration and components disclosed herein. Various modifications, changes, and variations apparent to those skilled in the art may be made in the arrangement, operation, and details of the methods and systems of the embodiments disclosed herein without departing from the spirit and scope of the invention. For example, filters applying the principles of the preferred embodiments can be used in various environments and applications for removing particles from fluids of all types, including gases, liquids, slurries, and mixtures thereof. The scope of the invention should therefore be determined only by the following claims.

What is claimed is:

1. A filtering apparatus for separating particles from a fluid stream, comprising:

a block of material;

a spiral flow path formed in the block in communication with an input and an output thereof; and a trap in communication with the flow path to capture particles passing through the flow path.

2. The filtering apparatus of claim 1, wherein the flow path forms a continuous curving spiral.

3. The filtering apparatus of claim 2, further comprising a plurality of traps.

4. The filtering apparatus of claim 2, wherein the trap is tangential to the flow path.

5. A filtering apparatus for separating particles from a fluid stream, comprising:

an input;

an output;

a spiral flow path in communication with the input and the output and including a plurality of angled turns; and a trap in communication with the flow path to capture particles passing through the flow path.

6. The filtering apparatus of claim 5, further comprising a plurality of traps.

7. The filtering apparatus of claim 6, wherein each trap couples to the flow path before an angled turn and continues in the direction of the flow path before the angled turn.

8. The filtering apparatus of claim 5, wherein the angled turns are approximately 45 degree turns.

9. The filtering apparatus of claim 5, wherein the angled turns are approximately 90 degree turns.

10. A filtering apparatus for separating particles from a fluid stream, comprising:

an input;

an output;

a spiral flow path in communication with the input and the output; and a trap in communication with the flow path to capture particles passing through the flow path, the trap having a rough surface to encourage particle adhesion.

11. The filtering apparatus of claim 1, wherein the flow path includes a rough surface to encourage particle adhesion.

12. A filtering apparatus for separating particles from a fluid stream, comprising:

an input;

an output;

a spiral flow path in communication with the input and the output; and a trap in communication with the flow path to capture particles passing through the flow path, the trap having an adhesive coating to encourage particle adhesion.

13. A filtering apparatus for separating particles from a fluid stream, comprising:

an input;

an output;

a spiral flow path in communication with the input and the output;

a trap in communication with the flow path to capture particles passing through the flow path, the trap including an orifice; and a pump in communication with the orifice.

14. The filtering apparatus of claim 13, wherein the trap tapers towards the orifice.

15. The filtering apparatus of claim 1, wherein the flow path includes an adhesive coating to encourage particle adhesion.

16. The filtering apparatus of claim 1, further comprising:

a lid placed on the block over the flow path to substantially seal the flow path.

17. The filtering apparatus of claim 1, wherein the material is selected from the group consisting of aluminum, titanium, silicon, nickel, stainless steel, and copper.

18. The filtering apparatus of claim 1, wherein the flow path is bordered by surfaces having a coating or passivation selected from the group consisting of oxides, nitrides, carbides, and mixtures thereof.

19. A filtering apparatus providing a flow path for separating particles from a fluid stream, comprising:

an input;

a first major baffle defining a first path, the first path in communication with the input;

a first minor baffle, substantially in the same plane as the first major baffle, and defining a first trap;

a first aperture separating the first major and minor baffles, the first aperture being nonaligned with the input and providing the only flow path exit from the first path;

a second major baffle parallel to the first major baffle and the first minor baffle, the first and second major baffles defining a second path in communication with the first aperture;

a second minor baffle, substantially in the same plane as the second major baffle, the second minor baffle and the first major baffle defining a second trap to capture particles; and a second aperture separating the second major and minor baffles and the first aperture, the second aperture providing the only flow path exit from the second path.

20. The filtering apparatus of claim 19, wherein the traps include a rough surface to encourage particle adhesion.

21. The filtering apparatus of claim 19, wherein the traps include an adhesive coating to encourage particle adhesion.

22. The filtering apparatus of claim 19, wherein the paths, traps, baffles, and apertures are formed by using the method of:

machining a block; and placing a lid on the block to substantially seal the paths and traps.

23. The filtering apparatus of claim 22, wherein the block comprises material selected from the group of aluminum, titanium, silicon, nickel, stainless steel, and copper.

24. The filtering apparatus of claim 19, wherein the baffles include a coating or passivation selected from the group consisting of oxides, nitrides, carbides, and mixtures thereof.

25. The filtering apparatus of claim 19, wherein at least one of the traps includes an orifice in communication with a pump.

26. The filtering apparatus of claim 25, wherein said trap tapers towards the orifice.

27. A filtering apparatus for separating particles from a fluid stream, comprising:

(a) an input;

(b) a first tube providing a first path and including, sealed first and second ends, and a first aperture disposed along the length of the first tube and in communication with the input and the first path;

(c) a second tube providing a second path and parallel to the first tube, the second tube having a cross-section smaller than the first tube and including, sealed first and second ends, and a second aperture nonaligned with the first aperture and disposed along the length of the second tube in communication with the first path and the second path so as to define a trap in the first tube; and (d) an output in communication with the second tube.

28. The filtering apparatus of claim 27, wherein the sealed first end of the second tube is proximate to the input and the second tube extends beyond the sealed first end to define a preliminary trap.

29. The filtering apparatus of claim 27, wherein the trap includes a rough surface to encourage particle adhesion.

30. The filtering apparatus of claim 27, wherein the trap includes an adhesive coating to encourage particle adhesion.

31. The filtering apparatus of claim 27, wherein the trap includes an orifice in communication with a pump.

32. The filtering apparatus of claim 27, wherein the trap tapers towards the orifice.

33. The filtering apparatus of claim 27, wherein the apertures are perpendicular to the input.

34. The filtering apparatus of claim 27, wherein the first and second tubes are concentric.

35. A filtering apparatus for separating particles from a fluid stream, comprising:

(a) an input;

(b) a first tube providing a first path and including, sealed first and second ends, and a first aperture disposed along the length of the first tube and in communication with the input and the first path;

(c) a second tube providing a second path and parallel to the first tube, including, sealed first and second ends, and a second aperture nonaligned with the first aperture and disposed along the length of the second tube in communication with the first path and the second path so as to define a first trap in the first tube;

(d) a third tube, providing a third path and parallel to the first and second tubes, including, sealed first and second ends, and a third aperture disposed along the length of the third tube and in communication with the input and the third path;

(e) a fourth tube, parallel to the third tube, including, sealed first and second ends providing a fourth path, and a fourth aperture nonaligned with the third aperture and disposed along the length of the fourth tube in communication with the third path and the fourth path so as to define a second trap in the third tube; and (f) an output in communication with the second and fourth tubes.

36. The filtering apparatus of claim 35, wherein the fourth tube has a smaller cross sectional area than the third tube to increase a velocity of the fluid stream as it flows through the filtering apparatus.

37. The filtering apparatus of claim 35, wherein the sealed first end of the third tube is proximate to the input and the third tube extends beyond the sealed first end to define a second preliminary trap.

38. The filtering apparatus of claim 35, wherein the traps include a rough surface to encourage particle adhesion.

39. The filtering apparatus of claim 35, wherein the traps include an adhesive coating to encourage particle adhesion.

40. The filtering apparatus of claim 35, wherein the apertures are perpendicular to the input.

41. The filtering apparatus of claim 35, further comprising:

an output tube parallel to the third and fourth tubes and defining an output path, the output tube including, a sealed first end, a second end in communication with the output, a first output aperture in communication with the fourth path, and a second output aperture in communication with the second path, the first and second output apertures defining an output trap in the output tube.

42. The filtering apparatus of claim 41, wherein the sealed first end of the output tube is proximate to the input and the output tube extends beyond the sealed first end to define a third preliminary trap.

43. The filtering apparatus of claim 41, wherein the output tube has a tapering diameter to increase velocity of the fluid stream along the output path.

44. A filtering apparatus for separating particles from a fluid stream, comprising:

a housing having first and second sealed ends and defining an interior;

an input disposed on the first sealed end and in communication with the interior;

an output disposed on the second sealed end and in communication with the interior;

a first plate defining a first chamber within the interior and in communication with the input, the first plate including, a first aperture, disposed at an intermediate location on the surface area of the first plate, and providing the only flow path exit from the first chamber; and a second plate defining a second chamber within the interior, the second plate including, a second aperture, disposed at an intermediate location on the surface area of the second plate, and providing the only flow path exit from the second chamber, the second aperture nonaligned with the first aperture.

45. The filtering apparatus of claim 44, wherein the housing is cylindrical, and the first and second plates are circular.

46. The filtering apparatus of claim 44, wherein the first and second chambers include a rough surface to encourage adhesion.

47. The filtering apparatus of claim 44, wherein the first and second chambers include an adhesive coating to encourage particle adhesion.

48. The filtering apparatus of claim 44, wherein the first chamber includes an orifice in communication with a pump.

49. The filtering apparatus of claim 44, further comprising:

a third plate defining a third chamber within the interior, the third plate including, a third aperture, disposed at an intermediate location on the surface area of the third plate, and providing the only flow path exit from the third chamber, the third aperture nonaligned with the second aperture.

50. The filtering apparatus of claim 44, wherein the first and second apertures are nonaligned with the input and output.

51. A filtering apparatus for separating particles from a fluid stream, comprising:

a cylindrical housing having first and second sealed ends and defining an interior;

an input disposed on the first sealed end and in communication with the interior;

an output disposed on the second sealed end and in communication with the interior; and a plurality of spaced-apart circular plates disposed within the interior, each plate including, a flow path aperture, disposed at an intermediate location on the surface area of the corresponding plate, and providing the only flow path exit through the corresponding plate, the flow path aperture nonaligned with the flow path aperture of adjacent plates.

52. A filtering apparatus according to claim 1, for use in an atomic layer deposition system.

53. A filtering apparatus according to claim 5, for use in an atomic layer deposition system.

54. A filtering apparatus according to claim 10, for use in an atomic layer deposition system.

55. A filtering apparatus according to claim 12, for use in an atomic layer deposition system.

56. A filtering apparatus according to claim 13, for use in an atomic layer deposition system.

57. A filtering apparatus according to claim 19, for use in an atomic layer deposition system.

58. A filtering apparatus according to claim 27, for use in an atomic layer deposition system.

59. A filtering apparatus according to claim 35, for use in an atomic layer deposition system.

60. A filtering apparatus according to claim 44, for use in an atomic layer deposition system.

61. A filtering apparatus according to claim 51, for use in an atomic layer deposition system.

* * * * *

UNITED STATES PATENT AND TRADEMARK OFFICE

CERTIFICATE OF CORRECTION

PATENT NO. : 6,936,086 B2
APPLICATION NO. : 10/400054
DATED : August 30, 2005
INVENTOR(S) : Kari Härkönen and Brad Aitchison It is certified that error appears in the above-identified patent and that said Letters Patent is hereby corrected as shown below:

At col. 5, line 47 “major and minor baffles” should read --major and minor baffles 60, 64--

At col. 6, line 1 “defines a pocket” should read --define a pocket--

At col. 7, line 8 “of the plate 80” should read --of the second plate 84--

At col. 7, line 42 “of the plates 82, 84” should read --of the plates 80, 84--

At col. 7, line 67 “of all the previous chambers” should read --of all the chambers--

At col. 8, line 12 “allows” should read --allow--

At col. 8, line 15 “scaled” should be replaced with --sealed--

At col. 9, line 30 insert a comma (--,--) after the number “8”

At col. 10, line 5 replace “ensure” with --ensures--

At col. 10, line 7 replace “separates” with --separate-

In the claims:

At col. 14, line 19, insert --particle-- before “adhesion”

Signed and Sealed this

Seventh Day of August, 2007

JON W. DUDAS

*Director of the United States Patent and Trademark Office*